United States Patent

Nomiya et al.

[11] 4,027,173
[45] May 31, 1977

[54] GATE CIRCUIT

[75] Inventors: Kosei Nomiya; Tadao Kikuchi, both of Tokyo, Japan

[73] Assignee: Hitachi, Ltd., Japan

[22] Filed: Nov. 21, 1975

[21] Appl. No.: 634,188

[30] Foreign Application Priority Data

Nov. 22, 1974 Japan .......................... 49-133655

[52] U.S. Cl. .......................... 307/200 B; 307/304; 361/10
[51] Int. Cl.² .................. H02H 9/04; H03K 3/353
[58] Field of Search .......... 307/202, 205, 214, 304; 317/9 C, 11 C, 11 E, 12 R, 16, 31, 33 SC

[56] References Cited

UNITED STATES PATENTS

| 3,395,290 | 7/1968 | Farina et al. | 307/205 X |
| 3,555,374 | 1/1971 | Usuda | 307/304 X |
| 3,588,525 | 6/1971 | Hatsukano et al. | 307/304 X |
| 3,636,385 | 1/1972 | Koepp | 307/304 |
| 3,651,340 | 3/1972 | Cliff | 307/304 X |
| 3,673,428 | 6/1972 | Athanas | 307/202 |
| 3,777,178 | 12/1973 | Gratzmuller | 317/11 C X |
| 3,819,952 | 6/1974 | Enomoto et al. | 307/202 |
| 3,934,159 | 1/1976 | Nomiya et al. | 307/304 |

Primary Examiner—John S. Heyman
Assistant Examiner—Larry N. Anagnos
Attorney, Agent, or Firm—Craig & Antonelli

[57] ABSTRACT

An input gate circuit of a semiconductor integrated circuit composed of insulated gate field-effect transistors, comprises a driving transistor and a load transistor which form an inverter, a transistor which prevents the input of the integrated circuit from being opened, and resistance means to protect the transistors. A first resistance is connected in series between an input terminal and the gate of the driving transistor, while another resistance is connected between the input terminal and one end of the input opening preventing transistor whose other end is connected to a power supply terminal.

6 Claims, 3 Drawing Figures

GATE CIRCUIT

FIELD OF THE INVENTION

This invention relates to a gate circuit. More particularly, it relates to an input gate circuit of a semiconductor integrated circuit device composed of insulated gate field-effect transistors (hereinbelow, simply termed "FETs").

DESCRIPTION OF THE PRIOR ART

In general, the input impedance of the gate of the FET is a high capacitive impedance. In the FET, therefore, unforeseen charges, even though very small in amount, induce a high voltage and cause dielectric breakdown of the gate.

In a semiconductor integrated circuit composed of such FETs, a capacitance as viewed from an externally-mounted terminal of a power supply line, a ground conductor or the like becomes large since the parasitic capacitances of the FETs are connected in parallel. For this reason, a high voltage is not induced by a very small amount of charges. Accordingly, the problem of the dielectric breakdown hardly occurs.

Figure 1:
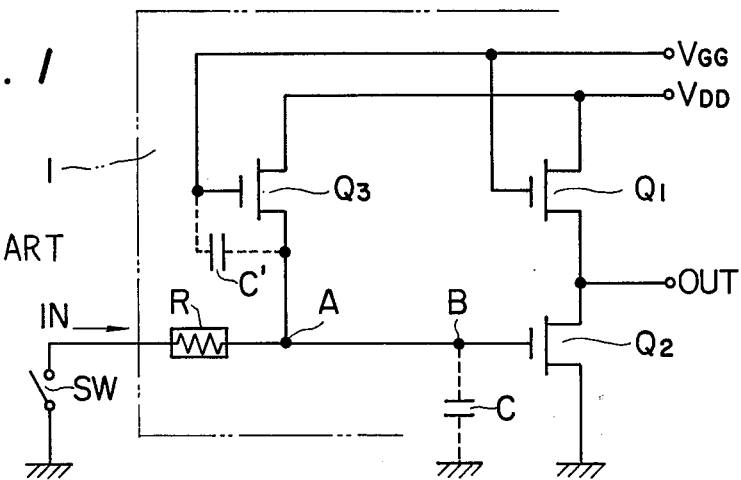
FIGS. 1 and 2 are circuit diagrams each showing a prior-art input gate circuit.

However, the problem exists in a circuit, such as input gate circuit, whose capacitance as viewed from an input terminal is very small. As counter-measures against static electricity for semiconductor integrated circuits composed of FETs, various circuits have been hitherto provided as described in "Denshi Zairyo" (Electronic Material) July 1971, Page 112, published in Japan.

Where an input signal is a signal of a mechanical switch as in an electronic desk top calculator, it is inadvisable to transmit binary levels by the switch. Accordingly, an expedient as illustrated in FIG. 1 has been commonly adopted. The presence of the transmission of ground potential by a switch Sw are designated by two values. On the other hand, an FET $Q_3$ for the open input is included in an integrated circuit 1, so that the logical state at the time when the switch Sw is open, is uniquely determined. Thus, various undesirable effects due to noises etc. are prevented. Further, a resistance R is connected for the protection of FETs.

Where the resistance R is incorporated as shown in FIG. 1 the input signal level (at a point A) is determined by the ratio between the resistance R and the conductance of the input opening preventing FET $Q_3$.

Accordingly, in order to reduce the loss of the input level (at the point A) and to secure the noise margin of the FET $Q_2$, the value of the resistance R should desirably be as small as possible. In contrast, the value of the resistance R should desirably be as large as possible for the protection of the gate of the FET $Q_2$. Heretofore, it has been necessary to set the value of the resistance R so as to compromise both the requirements. Therefore a malfunction of the FET $Q_2$ due to noise or the gate breakdown of the FET $Q_2$ due to noise etc. may occur.

Figure 2:
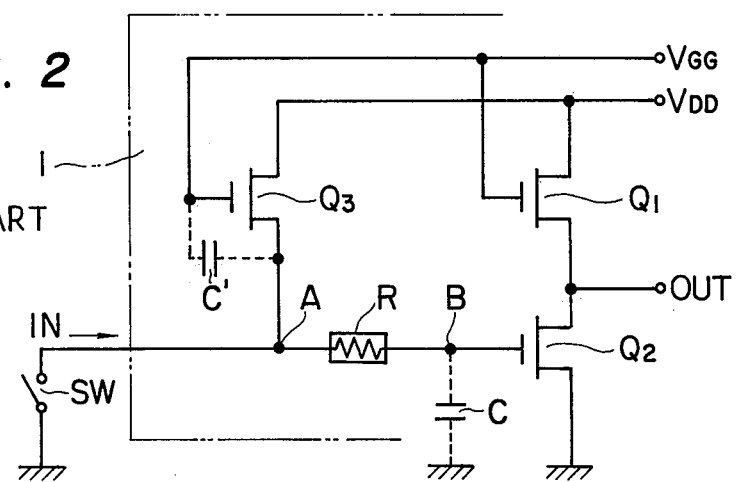

In this respect, as explained in the above-mentioned publication Denshi Zairyo, the problem can be solved by interposing the resistance R between the point A and a point B as in FIG. 2. It has been revealed, however, that the insulation of the input opening preventing FET $Q_3$ is destroyed with such a circuit arrangement. The cause for the destruction of the insulating is thought to be that, since the gate - source capacitance C' of the FET $Q_3$ is extremely small, a high voltage is induced by a very small amount of charge.

SUMMARY OF THE INVENTION

This invention has been developed in order to eliminate such a disadvantage, and has for its object to provide an input gate circuit which prevents the loss of the input signal level and which achieves the prevention of the dielectric breakdown of the gates of the FETs $Q_2$ and $Q_3$.

The fundamental construction of this invention for accomplishing the object resides in a semiconductor integrated circuit composed of insulated gate field-effect transistors, characterized in that a resistance $R_1$ is connected in series between an input terminal and one end of an input opening preventing transistor the other end of which is connected to a power supply terminal.

DETAILED DESCRIPTION OF THE INVENTION

Figure 3:
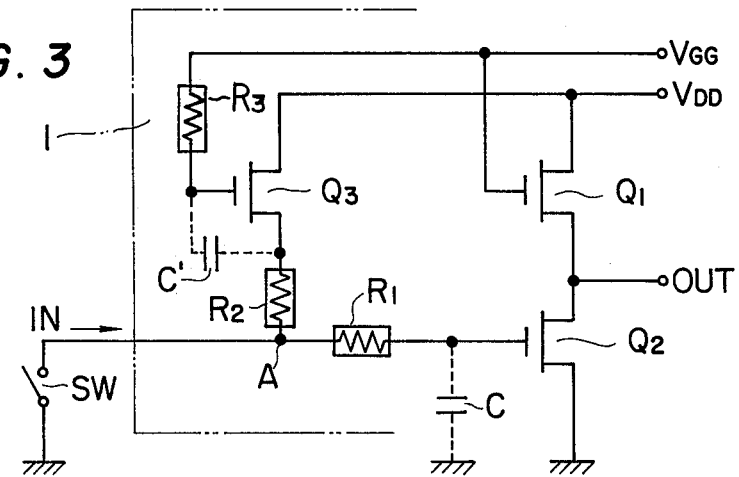
FIG. 3 is a circuit diagram showing an embodiment of this invention.

FIG. 3 is a circuit diagram which shows an embodiment of this invention.

In order to prevent the loss of the input signal level and to achieve the protection of the FETs $Q_2$ and $Q_3$, the FET protecting resistance is incorporated in the form of two or three divided parts as will be explained below.

In an inverter forming a gate circuit by the FETs $Q_1$ and $Q_2$, the gate of the driving FET $Q_2$ is connected to an input terminal through a protective resistance $R_1$. The input terminal is connected to the source of the input opening protecting FET $Q_3$ through a protective resistance $R_2$. The drain of the FET $Q_3$ is connected directly to a power supply terminal VDD, and the gate is connected to another power supply terminal VGG through a protective resistance $R_3$. A gate capacitor C is included between the protective resistance $R_1$ and the gate of the FET $Q_2$, while a capacitor C' is involved between the gate and the source of the FET $Q_3$.

As is apparent from FIG. 3, an integration circuit made up of the protective resistance $R_1$ and the gate capacitor C is formed between the gate of the driving FET $Q_2$ of the inverter and the input terminal. Accordingly, a voltage having an abrupt rise time due to noise from the input, etc. is suppressed by the integration circuit, and the voltage to be impressed on the gate of the FET $Q_2$ is suppressed. Since the protective resistance $R_1$ is larger, the voltage to be exerted on the gate of the FET $Q_2$ can be suppressed more. Thus, dielectric breakdown of the FET $Q_2$ can be prevented. Further, since the signal level of the input terminal is prescribed by the signal level of switch means or the like, the noise margin is not adversely affected in comparison with that of the prior-art circuit (FIG. 1). A level loss is therefore prevented.

At the source of the input opening protecting FET $Q_3$, an integration circuit is constructed of the protective resistance $R_2$ and the parasitic capacitor C'. The protection of the FET $Q_3$ can accordingly be achieved for the same reason as stated above.

Further, by inserting a protective resistance $R_3$ between the gate of the FET $Q_3$ and the power source VGG, breakdown can be prevented in such manner that if a breakdown current begins to flow, the voltage between the gate and source of the FET $Q_3$ is made small by the resistance $R_3$.

The values of the resistances $R_1$–$R_3$ of such functions must be large, yet the resistance $R_1$ and $R_2$ cannot be very large. The reason is that, when the values of the resistance $R_1$ and $R_2$ are made large, the charging and discharging time of the capacitor C becomes long, to increase the "on-off" operation time of the FET $Q_2$. The values of the resistances $R_1$ and $R_2$ must accordingly, be appropriately selected.

This invention can adopt a variety of modifications without being restricted to the foregoing embodiment.

By way of example, the effects are more enhanced by connecting the clamp resistances $R_1$–$R_3$ and clamp diodes in parallel, respectively.

This invention can be extensively applied as an input circuit of a semiconductor integrated circuit employing FETs.

We claim:

1. In a semiconductor integrated circuit comprising:
   first and second field-effect transistors having their source and drain terminals connected in series between first and second reference voltage terminals;
   an output terminal connected to said first and second field-effect transistors;
   an input terminal to which a voltage input signal is applied;
   a first resistor connected between said input terminal and the gate of said second transistor for protecting the gate of said second field-effect transistor from dielectric breakdown-inducing high voltage surges applied at said input terminal; and
   a third field effect transistor coupled between said second reference voltage terminal and said input terminal;
   the improvement comprising:
   a second resistor connected between said third field effect transistor and said input terminal for suppressing noise voltage surges applied at said input terminal and thereby providing protection for said third field effect transistor.

2. The improvement according to claim 1, further comprising a third resistor connected between the gate of said third field effect transistor and a third reference voltage terminal.

3. The improvement according to claim 2, wherein the gate of said first transistor is connected to said third reference voltage terminal.

4. The improvement according to claim 1, wherein said second resistor is connected between the source of said third transistor and said input terminal.

5. The improvement according to claim 4, further comprising a third resistor connected between the gate of said third field effect transistor and a third reference voltage terminal.

6. The improvement according to claim 5, wherein the gate of said first transistor is connected to said third reference voltage terminal.

* * * * *